United States Patent
Lim et al.

(10) Patent No.: US 9,276,198 B2
(45) Date of Patent: Mar. 1, 2016

(54) MAGNETIC MEMORY DEVICES

(71) Applicants: Woo Chang Lim, Seoul (KR); Sangyong Kim, Suwon-si (KR); Whankyun Kim, Seoul (KR); Sang Hwan Park, Hwaseong-si (KR); Jeongheon Park, Hwaseong-si (KR)

(72) Inventors: Woo Chang Lim, Seoul (KR); Sangyong Kim, Suwon-si (KR); Whankyun Kim, Seoul (KR); Sang Hwan Park, Hwaseong-si (KR); Jeongheon Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/967,340

(22) Filed: Aug. 14, 2013

(65) Prior Publication Data

US 2014/0061828 A1    Mar. 6, 2014

(30) Foreign Application Priority Data

Aug. 30, 2012   (KR) ................ 10-2012-0095797

(51) Int. Cl.
*H01L 43/08* (2006.01)
*G11C 11/16* (2006.01)

(52) U.S. Cl.
CPC .............. *H01L 43/08* (2013.01); *G11C 11/161* (2013.01)

(58) Field of Classification Search
CPC ...... H01L 43/08; H01L 27/228; H01L 27/222
See application file for complete search history.

(56) References Cited

U.S. PATENT DOCUMENTS

| | | | |
|---|---|---|---|
| 6,205,052 B1 * | 3/2001 | Slaughter et al. | 365/173 |
| 7,119,410 B2 | 10/2006 | Saito et al. | |
| 7,889,543 B2 | 2/2011 | Morise et al. | |
| 7,894,246 B2 | 2/2011 | Ueda et al. | |
| 7,940,600 B2 | 5/2011 | Dimitrov et al. | |
| 8,004,881 B2 | 8/2011 | Zhu et al. | |
| 8,039,913 B2 | 10/2011 | Zheng et al. | |
| 8,169,810 B2 | 5/2012 | Zhu et al. | |
| 2005/0057960 A1 | 3/2005 | Saito et al. | |
| 2006/0102969 A1 * | 5/2006 | Huai et al. | 257/421 |
| 2007/0297220 A1 | 12/2007 | Yoshikawa et al. | |
| 2008/0180859 A1 | 7/2008 | Ueda et al. | |
| 2008/0310219 A1 * | 12/2008 | Chen et al. | 365/173 |
| 2009/0161422 A1 | 6/2009 | Zhu et al. | |
| 2009/0213638 A1 * | 8/2009 | Morise et al. | 365/145 |
| 2010/0084725 A1 | 4/2010 | Zhu et al. | |
| 2010/0090261 A1 | 4/2010 | Zheng et al. | |
| 2010/0135067 A1 | 6/2010 | Dimitrov et al. | |
| 2010/0258781 A1 * | 10/2010 | Phatak et al. | 257/4 |
| 2011/0316102 A1 | 12/2011 | Ohmori et al. | |

FOREIGN PATENT DOCUMENTS

JP    2008187048 A    8/2008

* cited by examiner

*Primary Examiner* — Tucker J Wright
(74) *Attorney, Agent, or Firm* — Renaissance IP Law Group LLP

(57) ABSTRACT

A magnetic memory device according to embodiments includes a first reference magnetic layer on a substrate, a second reference magnetic layer on the first reference magnetic layer, a free layer between the first reference magnetic layer and the second reference magnetic layer, a first tunnel barrier layer between the first reference magnetic layer and the free layer, and a second tunnel barrier layer between the second reference magnetic layer and the free layer. The first reference magnetic, second reference magnetic and free layers each have a magnetization direction substantially perpendicular to a top surface of the substrate. A resistance-area product (RA) value of the first tunnel barrier layer is greater than that of the second tunnel barrier layer.

14 Claims, 16 Drawing Sheets

MAGNETIC MEMORY DEVICES

CROSS-REFERENCE TO RELATED APPLICATIONS

This U.S. non-provisional patent application claims priority under 35 U.S.C. §119 to Korean Patent Application No. 10-2012-0095797, filed on Aug. 30, 2012, the entirety of which is incorporated by reference herein.

BACKGROUND

The inventive concept relates to semiconductor devices and, more particularly, to magnetic memory devices.

There is an increased demand for high density, lower power consumption and non-volatile memory devices with the development of portable computing devices and wireless communication devices. Magnetic memory devices have become one of the main candidates that can satisfy such demands.

Particularly, a tunnel magnetoresistance (TMR) effect occurring in a magnetic tunnel junction (MTJ) may be used as a data storing mechanism in the magnetic memory device. MTJs having the TMR of hundreds % to thousands % have been developed in $21^{st}$ century, such that various researches have been conducted for the magnetic memory devices having the MTJ.

SUMMARY

Embodiments of the inventive concept may provide magnetic memory devices having improved electrical characteristics.

In one aspect, a magnetic memory device may include: a first reference magnetic layer on a substrate; a second reference magnetic layer on the first reference magnetic layer; a free layer between the first reference magnetic layer and the second reference magnetic layer; a first tunnel barrier layer between the first reference magnetic layer and the free layer; and a second tunnel barrier layer between the second reference magnetic layer and the free layer. The first reference magnetic layer, the second reference magnetic layer, and the free layer may each have a magnetization direction substantially perpendicular to a top surface of the substrate. A resistance-area product (RA) value of the first tunnel barrier layer may be greater than a RA value of the second tunnel barrier layer.

In another aspect, a magnetic memory device may include: a first tunnel barrier layer disposed at a first height from a substrate; a second tunnel barrier layer disposed at a second height greater than the first height from the substrate, the second tunnel barrier layer thinner than the first tunnel barrier layer; a free layer disposed between the first tunnel barrier layer and the second tunnel barrier layer; a first reference magnetic layer disposed under the first tunnel barrier layer; and a second reference magnetic layer disposed on the second tunnel barrier layer. The first reference magnetic layer, the second reference magnetic layer, and the free layer may each have a magnetization direction substantially perpendicular to a top surface of the substrate.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
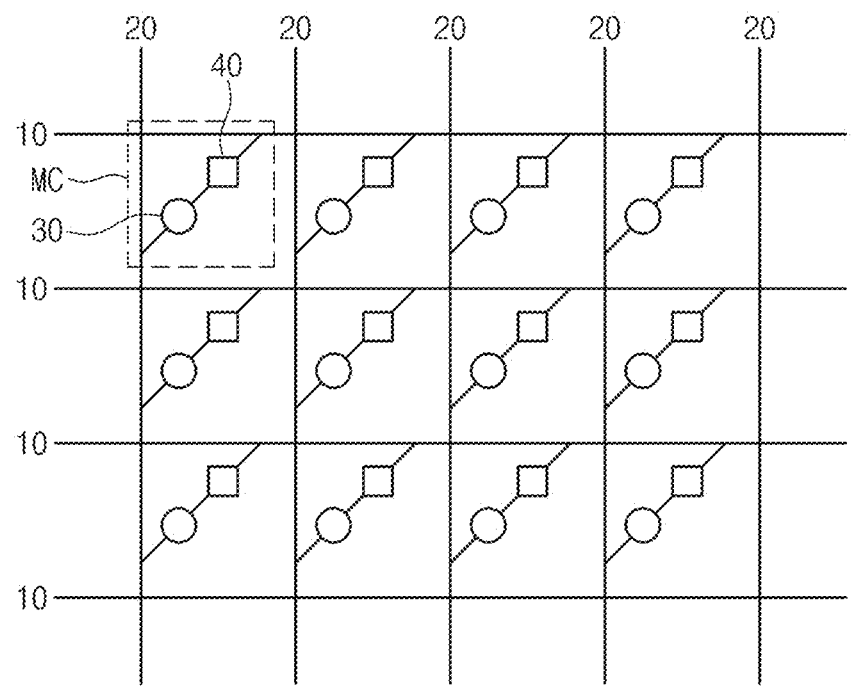
FIG. 1 is a schematic diagram illustrating a memory array of a magnetic memory device according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, magnetic memory devices according to embodiments will be described in detail with respect to the drawings.

Figure 2:
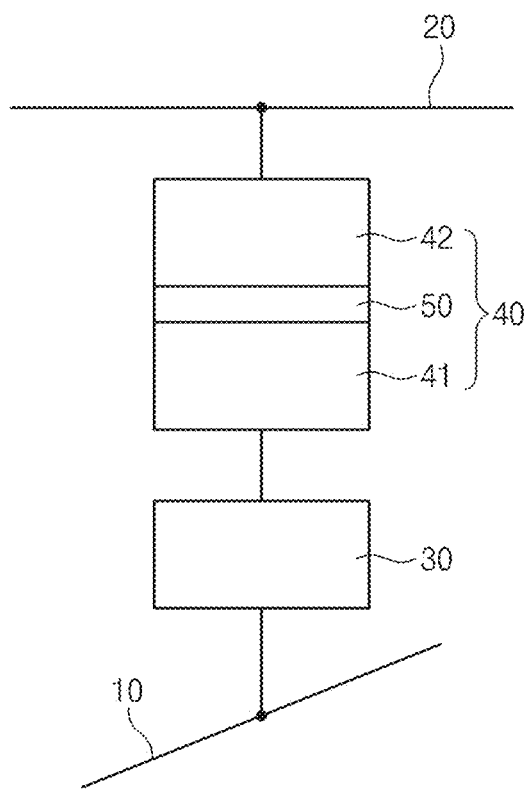
FIG. 2 is a schematic diagram illustrating a unit memory cell of a magnetic memory device according to exemplary embodiments of the inventive concept.

FIG. 1 is a schematic diagram illustrating a memory array of a magnetic memory device according to exemplary embodiments of the inventive concept. FIG. 2 is a schematic diagram illustrating a unit memory cell of a magnetic memory device according to exemplary embodiments of the inventive concept.

Referring to FIGS. 1 and 2, a plurality of unit memory cells MC may be two-dimensionally or three-dimensionally arranged. The unit memory cell MC may be connected between a first interconnection 10 and a second interconnection 20 crossing each other. One of the first and second interconnections 10 and 20 may be used as a word line, and the other of the first and second interconnections 10 and 20 may be used as a bit line.

Each of the unit memory cells MC includes a magnetic memory element 40 and a selection element 30. The selection element 30 and the magnetic memory element 40 may be electrically connected in series with each other. The magnetic memory element 40 may be connected between the second interconnection 20 and the selection element 30, and the selection element 30 may be connected between the magnetic memory element 40 and the first interconnection 10.

The magnetic memory element 40 may include a magnetic tunnel junction (MTJ). The selection element 30 may selectively control a flow of charges passing through the magnetic tunnel junction. For example, the selection element 30 may be one of a diode, a PNP bipolar transistor, an NPN bipolar transistor, a NMOS field effect transistor, and a PMOS field effect transistor. If the selection element 30 is a three-terminal element such as the bipolar transistor or the MOS field effect transistor, an additional interconnection (not illustrated) may be connected to the selection element 30.

The magnetic tunnel junction of the magnetic memory element 40 may include a plurality of magnetic layers 41 and 42 and a tunnel barrier layer 50 disposed between the magnetic layers 41 and 42. One of the magnetic layers 41 and 42 may be a reference layer having a fixed magnetization direction regardless of an external magnetic field under a general environment of using the magnetic memory element 40. The other of the magnetic layers 41 and 42 may be a free layer having a variable magnetization direction that can be changed by the external magnetic field.

The magnetic tunnel junction may have a greater electrical resistance when the magnetization directions of the reference layer and the free layer are anti-parallel to each other than when the magnetization directions of the reference layer and the free layer are parallel to each other. In other words, the magnetization direction of the free layer may be changed to control the electrical resistance of the magnetic tunnel junction. Thus, the unit memory cell MC may store data by the difference between the electrical resistances of the magnetic memory element 40 according to the magnetization directions of the magnetic layers 41 and 42.

Figure 3:
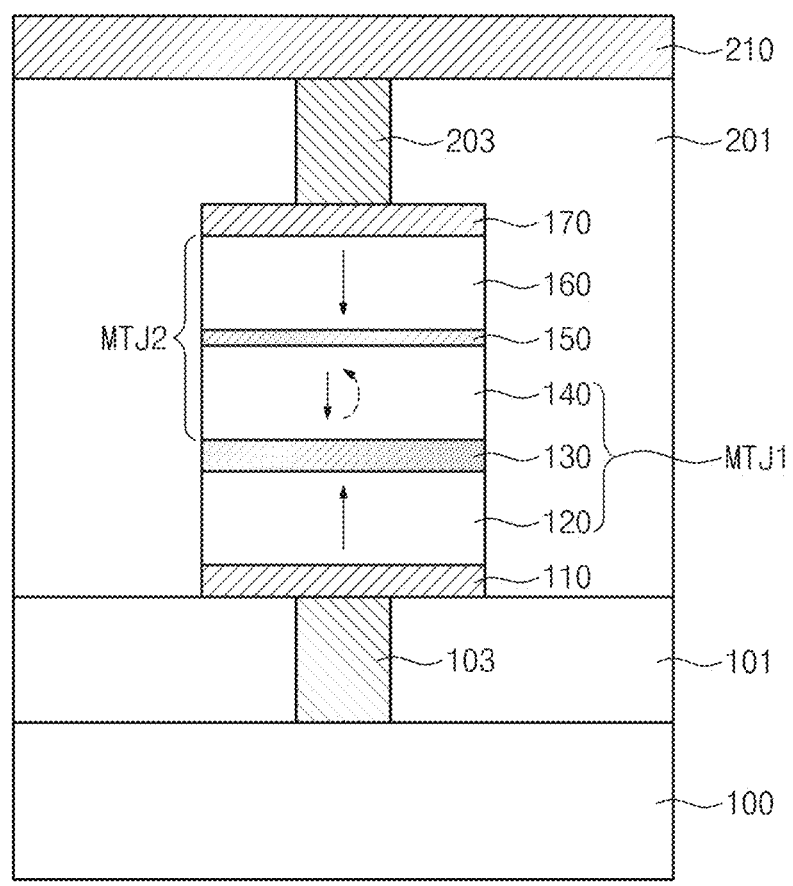
FIG. 3 is a cross-sectional view illustrating a magnetic memory element of a magnetic memory device according to a first embodiment of the inventive concept.

FIG. 3 is a cross-sectional view illustrating a magnetic memory element of a magnetic memory device according to a first embodiment of the inventive concept.

Referring to FIG. 3, a first interlayer dielectric layer 101 including a lower contact plug 103 may be disposed on a substrate 100. The lower contact plug 103 may be electrically connected to the selection element 30 of FIG. 2. The first interlayer dielectric layer 101 may include at least one of silicon oxide, silicon nitride, silicon oxynitride, or a low-k dielectric material. The first interlayer dielectric layer 101 may be a single-layer or a multi-layer including a plurality of stacked layers. Alternatively, the first interlayer dielectric layer 101 may include a plurality of stacked insulating layers and a conductive or semiconductor layer disposed between the stacked insulating layers. The lower contact plug 103 may include a conductive material. For example, the lower contact plug 103 may include at least one of a semiconductor doped with dopants (e.g., doped silicon, doped germanium, and/or a doped silicon-germanium), a metal (e.g., titanium, tantalum, and/or tungsten), or a conductive metal nitride (e.g., titanium nitride, tantalum nitride, and/or tungsten nitride).

A magnetic memory element may be disposed on the first interlayer dielectric layer 101. In an embodiment, the magnetic memory element may include a first magnetic tunnel junction pattern MTJ1 and a second magnetic tunnel junction pattern MTJ2, i.e., a dual MTJ. In some embodiments, additional magnetic layers may be formed on the magnetic memory element shown in FIG. 3, depending on the desired application.

In more detail, the magnetic memory element may include a first reference layer 120, a first tunnel barrier layer 130, a free layer 140, a second tunnel barrier layer 150, and a second reference layer 160. Additionally, the magnetic memory element may further include a seed electrode layer 110 disposed between the lower contact plug 103 and the first reference layer 120, and a capping electrode layer 170 disposed between the second reference layer 160 and an upper contact plug 203. The first reference layer 120, the first tunnel barrier layer 130, and the free layer 140 may constitute the first magnetic tunnel junction pattern MTJ1. The free layer 140, the second tunnel barrier layer 150, and the second reference layer 160 may constitute the second magnetic tunnel junction pattern MTJ2.

The first reference layer 120 may have a first magnetization direction substantially perpendicular to a top surface of the substrate 100. The first magnetization direction is fixed. A top surface of the first reference layer 120 may be in direct contact with the first tunnel barrier layer 130. Thus, the top surface of the first reference layer 120 may have a good surface roughness. In other words, the first reference layer 120 may provide good lattice matching when the first tunnel barrier layer 130 is formed. For example, the first reference layer may have a mean surface roughness of about 2 Å or less.

The first reference layer 120 may have a material and/or a structure having a first magnetization direction fixed to be substantially perpendicular to the top surface of the substrate 100. For example, the first reference layer 120 may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, a perpendicular magnetic material having an $L1_1$ (superlattice) structure, or any alloy thereof. The perpendicular magnetic material having the $L1_0$ structure may include FePt of the $L1_0$ structure, FePd of the $L1_0$ structure, CoPd of the $L1_0$ structure, and/or CoPt of the $L1_0$ structure. If the first reference layer 120 includes CoFeTb, a content ratio of terbium (Tb) may be equal to or greater than about 10% in CoFeTb. Likewise, if the first reference layer 120 includes CoFeGd, a content ratio of gadolinium (Gd) may be equal to or greater than about 10% in CoFeGd. In another embodiment, the first reference layer 120 may include a perpendicular magnetic structure having magnetic layers and non-magnetic layers alternately and repeatedly stacked. For example, the perpendicular magnetic structure may include at least one of $(Co/Pt)n$, $(CoFe/Pt)n$, $(CoFe/Pd)n$, $(Co/Pd)n$, $(Co/Ni)n$, $(CoNi/Pt)n$, $(CoCr/Pt)n$, and $(CoCr/Pd)n$ (where n is the number of alternately stacked magnetic and non-magnetic layers).

The seed electrode layer 110 disposed under the first reference layer 120 may function as a seed of the first reference layer 120. The seed electrode layer 110 may include a conductive material having low reactivity. For example, if the first reference layer 120 includes perpendicular magnetic material having the $L1_0$ structure, the seed electrode layer 110 may be a conductive metal nitride having a sodium chloride (NaCl) structure, for example, titanium nitride, tantalum nitride, chromium nitride, or vanadium nitride.

The first tunnel barrier layer 130 may have a thickness less than a spin diffusion length. The spin diffusion length may be a distance over which electrons remains polarized. That is, the spin diffusion length may be a distance that electrons can move without changing spin directions of the electrons. The first tunnel barrier layer 130 may include an insulating material. For example, the first tunnel barrier layer 130 may include at least one of magnesium oxide, titanium oxide, aluminum oxide, magnesium-zinc oxide, or magnesium-boron oxide. In an embodiment, the first tunnel barrier layer 130 may be formed of magnesium oxide (MgO), and a top surface of the first tunnel barrier layer 130 may have a (001) crystal plane substantially parallel to the top surface of the substrate 100. In an embodiment, a thickness of the first tunnel barrier layer 130 formed of magnesium oxide (MgO) may have a range of about 8 Å to about 15 Å.

The first tunnel bather layer 130 may be formed using a radio frequency (RF) sputtering deposition method. In an embodiment, the first tunnel barrier layer 130 may be deposited by a sputtering process using a magnesium oxide (MgO) target in an argon atmosphere or by a sputtering process using oxidation reaction utilizing a magnesium (Mg) target in an oxygen atmosphere. In another embodiment, the deposition of a metal (Mg) layer on the first reference layer 120 and the oxidation of the metal (Mg) layer may be alternately and repeatedly performed to form the first tunnel barrier layer 130. In still another embodiment, the first tunnel barrier layer 130 may be formed by a molecular beam epitaxy (MBE) method or an electron beam deposition method using magnesium oxide (MgO).

The free layer 140 may be in direct contact with a top surface of the first tunnel barrier layer 130. Additionally, the free layer 140 may be in direct contact with a bottom surface of the second tunnel barrier layer 150. The free layer 140 may be a magnetic layer having a changeable magnetization direction substantially perpendicular to the top surface of the substrate 100. The magnetization direction of the free layer 140 can be changed to be parallel or anti-parallel to the magnetization directions of the first and second reference layers 120 and 160.

The free layer 140 may be formed of a magnetic material having perpendicular magnetic anisotropy. Additionally, the free layer 140 may be formed of a magnetic material aligned with the (001) crystal plane of the first tunnel barrier layer 130. The free layer 140 may be formed on the (001) crystal plane of the first tunnel barrier layer 130, so that the free layer 140 may be crystal-grown in a [001] direction. Thus, a top surface of the free layer 140 may have a (001) crystal plane substantially parallel to the top surface of the substrate 100.

For example, the free layer 140 may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, or any alloy thereof.

The second tunnel barrier layer 150 may have a thickness less than the spin diffusion length. The second tunnel barrier layer 150 may include an insulating material. For example, the second tunnel barrier layer 150 may include at least one of magnesium oxide, titanium oxide, aluminum oxide, magnesium-zinc oxide, or magnesium-boron oxide.

In an embodiment, the second tunnel bather layer 150 may be formed of magnesium oxide (MgO) and may have a thickness less than that of the first tunnel barrier layer 130. In other words, the thickness of the first tunnel barrier layer 130 may be greater than the thickness of the second tunnel barrier layer 150. A ratio of the thickness of the second tunnel barrier layer 150 to the thickness of the first tunnel barrier layer 130 may have a range of about 1:1.5 to about 1:3. For example, the second tunnel barrier layer 150 may have the thickness of about 5 Å to about 10 Å.

The second tunnel barrier layer 150 may be a magnesium oxide (MgO) layer formed by a RF sputtering deposition method. Alternatively, the deposition of a metal (Mg) layer on the free layer 140 and the oxidation of the metal (Mg) layer may be alternately and repeatedly performed to form the second tunnel barrier layer 150. In still another embodiment, the second tunnel barrier layer 150 may be formed by a molecular beam epitaxy (MBE) method or an electron beam deposition method using magnesium oxide (MgO).

The magnesium oxide (MgO) layer may be deposited and then the deposited magnesium oxide (MgO) may be crystallized by a high temperature thermal annealing process to form the second tunnel barrier layer 150. Thus, second tunnel barrier layer 150 may have crystallizability. The second tunnel barrier layer 150 may be influenced by the crystallizability of an underlying layer when the second tunnel barrier layer 150 is crystallized by the high temperature thermal annealing process. Thus, a top surface of the second tunnel barrier layer 150 may have a (001) crystal plane substantially parallel to the top surfaces of the first tunnel barrier layer 130 and the free layer 140.

In some embodiments, the first tunnel barrier layer 130 and the second tunnel barrier layer 150 may be formed of other insulating materials such as aluminum oxide.

The second reference layer 160 may be in direct contact with the top surface of the second tunnel barrier layer 150. The second reference layer 160 may have a second magnetization direction substantially perpendicular to the top surface of the free layer 140. The second magnetization direction is fixed. The second magnetization direction of the second reference layer 160 may be opposite (or anti-parallel) to the first magnetization direction of the first reference layer 120.

For example, the second reference layer 160 may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, or any alloy thereof.

The perpendicular magnetic material having the $L1_0$ structure may include FePt of the $L1_0$ structure, FePd of the $L1_0$ structure, CoPd of the $L1_0$ structure, and/or CoPt of the $L1_0$ structure. If the second reference layer 160 includes CoFeTb, a content ratio of terbium (Tb) in CoFeTb may be equal to or greater than about 10%. If the second reference layer 160 includes CoFeGd, a content ratio of gadolinium (Gd) in CoFeGd may be equal to or greater than about 10%. In another embodiment, the second reference layer 160 may include a perpendicular magnetic structure having magnetic layers and non-magnetic layers alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacking the magnetic layer and the non-magnetic layer).

The capping electrode layer 170 on a top surface of the second reference layer 160 may be formed of a conductive material. The capping electrode layer 170 may include a metal. For example, the capping electrode layer 170 may include at least one of ruthenium (Ru), tantalum (Ta), palladium (Pd), titanium (Ti), platinum (Pt), silver (Ag), gold (Au), or copper (Cu).

A second interlayer dielectric layer 201 may be disposed on the magnetic memory element and the first interlayer dielectric layer 101. The upper contact plug 203 may be formed in the second interlayer dielectric layer 201. The upper contact plug 203 may be electrically connected to the capping electrode layer 170. An interconnection 210 may be disposed on the second interlayer dielectric layer 201. The interconnection 210 may be electrically connected to the upper contact plug 203. The interconnection 210 may be the second interconnection 20 (e.g., the bit line) illustrated in FIG. 2.

The second interlayer dielectric layer 201 may include at least one of silicon oxide, silicon nitride, silicon oxynitride, or a low-k dielectric material. The upper contact plug 203 may include a conductive material, e.g., at least one of a metal (e.g., titanium, tantalum, copper, aluminum, and/or tungsten) or a conductive metal nitride (e.g., titanium nitride, tantalum nitride, and/or tungsten nitride). The interconnection 210 may include at least one of a metal (e.g., titanium, tantalum, copper, aluminum, and/or tungsten) or a conductive metal nitride (e.g., titanium nitride, tantalum nitride, and/or tungsten nitride).

A program operation of the aforementioned magnetic memory element including the magnetic tunnel junction patterns MTJ1 and MTJ2 will be described below.

When the first magnetization direction of the first reference layer 120 is anti-parallel to the magnetization direction of the free layer 140, a program current may flow from the capping electrode layer 170 to the seed electrode layer 110. Electrons in the program current may flow through the first reference layer 120 to the free layer 140. Here, major electrons may have spins parallel to the first magnetization direction of the first reference layer 120, and minor electrons may have spins anti-parallel to the first magnetization direction of the first reference layer 120.

When the program current flows from the capping electrode layer 170 to the seed electrode layer 110, the major electrons having the spins parallel to the first magnetization direction of the first reference layer 120 may be accumulated in the free layer 140. The magnetization direction of the free layer 140 may be changed to be parallel to the first magnetization direction of the first reference layer 120 by spin torque of the major electrons accumulated in the free layer 140.

The major electrons passing through the free layer 140 may be reflected by the second reference layer 160 having the second magnetization direction. The reflected major electrons may return to and be accumulated in the free layer 140. Thus, the reflected major electrons may assist the change in the magnetization direction of the free layer 140. Additionally, the minor electrons may have the spins parallel to the second magnetization direction of the second reference layer 160, such that the minor electrons may smoothly pass through the second reference layer 160. As a result, a critical current density necessary to change the magnetization direction of the free layer 140 may be reduced.

Meanwhile, the program current may flow from the seed electrode layer 110 to the capping electrode layer 170. In this case, electrons may flow from the capping electrode layer 170 to the seed electrode layer 110. In other words, the electrons may flow from the second reference layer 160 to the free layer 140. Here, major electrons may have spins parallel to the second magnetization direction of the second reference layer 160, and minor electrons may have spins anti-parallel to the second magnetization direction of the second reference layer 160.

The major electrons passing through the second reference layer 160 may be accumulated in the free layer 140 to change the magnetization direction of the free layer 140. The major electrons passing through the free layer 140 may be reflected by the first reference layer 120 having the first magnetization direction and then may be accumulated in the free layer 140. The reflected major electrons may assist the change in the magnetization direction of the free layer 140. The minor electrons passing through the free layer 140 may have the spins parallel to the first magnetization direction of the first reference layer 120, such that the minor electrons may smoothly pass through the first reference layer 120.

Figure 4:
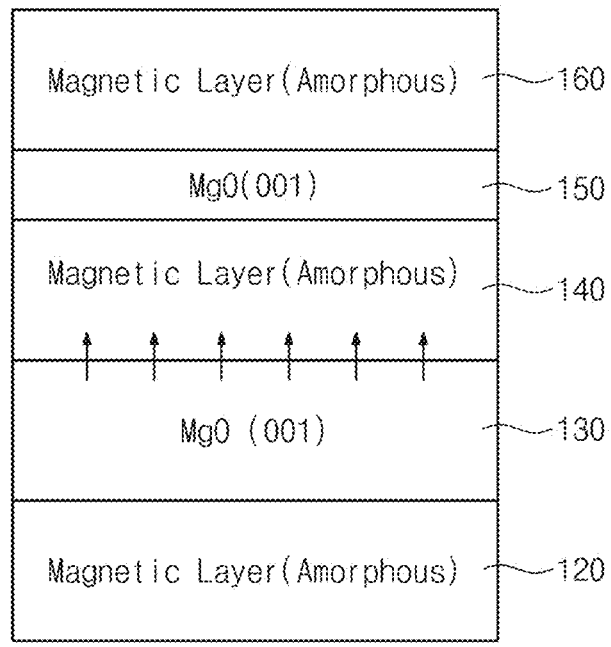
FIG. 4 is schematic diagram illustrating a crystallization direction in a magnetic memory element according to exemplary embodiments of the inventive concept.
Figure 5:
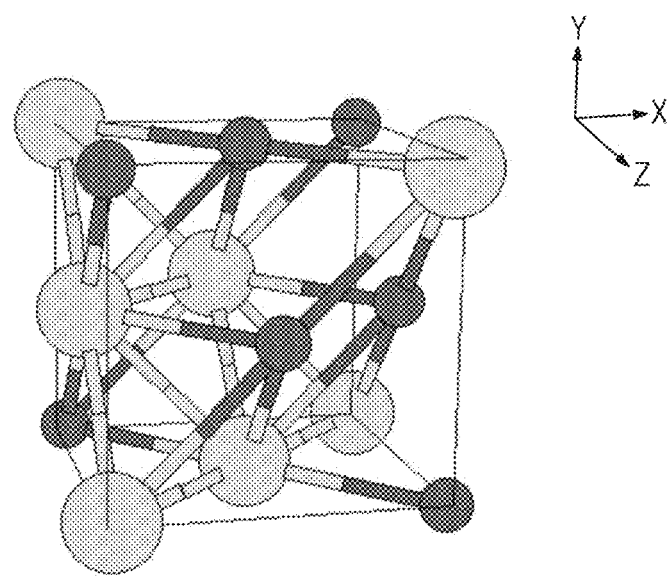
FIG. 5 illustrates a crystal structure of a magnetic layer in a magnetic memory element according to exemplary embodiments of the inventive concept.
Figure 6A:
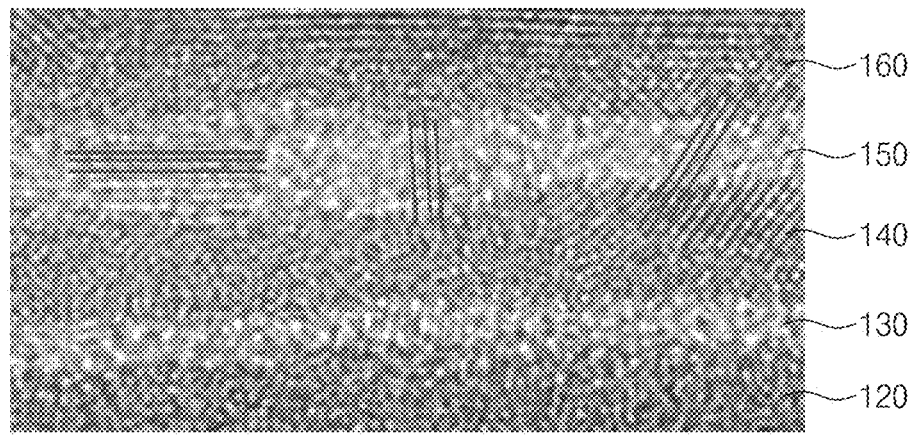
FIGS. 6A and 6B are transmission electron microscope (TEM) images for illustrating crystallizability difference according to thicknesses of first and second tunnel barrier layers in a magnetic memory element according to exemplary embodiments of the inventive concept.
Figure 6B:
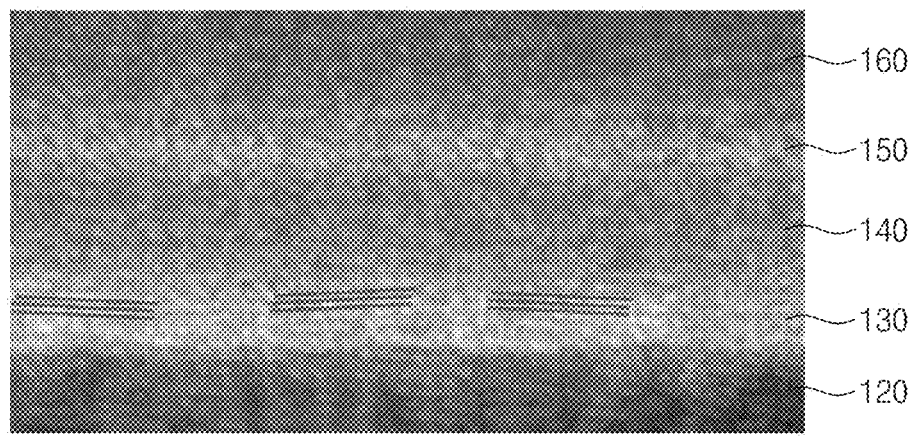

FIG. 4 is schematic diagram illustrating a crystallization direction in a magnetic memory element according to exemplary embodiments of the inventive concept. FIG. 5 illustrates a crystal structure of a magnetic layer in a magnetic memory element according to exemplary embodiments of the inventive concept. FIGS. 6A and 6B are transmission electron microscope (TEM) images for illustrating crystallizability difference according to thicknesses of first and second tunnel barrier layers in a magnetic memory element according to exemplary embodiments of the inventive concept.

According to some embodiments of the inventive concept, the magnetic tunnel junction having a high magnetic resistance (MR) and a low contact resistance may be desired for realizing a high performance and high integrated magnetic memory element. Particularly, a resistance-area product (RA) value obtained by multiplying a resistance by an area of the magnetic tunnel junction is an important variable determining a signal to noise (S/N) ratio and a resistance-capacitor (RC) time constant in the magnetic memory device. The resistance of the magnetic tunnel junction may be varied according to a thickness of the magnetic tunnel junction.

Referring to FIG. 4, for writing and sensing data, a resistance of the first tunnel barrier layer 130 is different from a resistance of the second tunnel barrier layer 150 in the magnetic memory device including the first and second magnetic tunnel junction patterns.

To achieve this, when the first and second tunnel barrier layers 130 and 150 are formed of the magnesium oxide (MgO) layer, the thickness of the first tunnel barrier layer 130 may be less than or greater than the thickness of the second tunnel barrier layer 150. As a thickness of the magnesium oxide (MgO) layer increases, a resistance of the magnesium oxide (MgO) layer may increase. In other words, the resistance of the magnesium oxide (MgO) layer may increase in proportion to the thickness of the magnesium oxide (MgO) layer.

When the thickness of the first tunnel barrier layer 130 is less than the thickness of the second tunnel barrier layer 150, a stray field applied to the free layer 140 may be easily controlled. However, as the thickness of the magnesium oxide (MgO) layer is reduced, the crystallizability of the magnesium oxide (MgO) layer may be deteriorated. Thus, as illustrated in FIG. 6A, the crystallizabilities of the second tunnel barrier layer 150 and a magnetic layer (i.e., the free layer 140) on the first tunnel barrier layer 130 may be deteriorated when the first tunnel barrier layer 130 is thinner than the second tunnel barrier layer 150. FIG. 6A shows the second tunnel barrier layer 150 thicker than the first tunnel barrier layer 130. In FIG. 6A, the thicker second tunnel barrier layer 150 has a non-uniform crystal direction. Thus, the RA values and resistance dispersions of the first and second tunnel barrier layers 130 and 150 may increase, such that difference between the resistances of the first and second tunnel barrier layers 130 and 150 may be reduced. It may be difficult to sense the data from the magnetic memory element if the resistance difference of the first and second tunnel barrier layers 130 and 150 is reduced.

Alternatively, as illustrated in FIG. 6B, when the thickness of the first tunnel barrier layer 130 is greater than the thickness of the second tunnel barrier layer 150, the magnetic layer (i.e., the free layer 140) and the second tunnel barrier layer 150 may be crystallized using the first tunnel barrier layer 130 having excellent crystallizability as a seed. Thus, the crystallizabilities of the magnetic layer and the second tunnel barrier layer 150 may be improved. FIG. 6B shows the first tunnel barrier layer 130 thicker than the second tunnel barrier layer 150. In FIG. 6B, the thick first tunnel barrier layer 130 has a uniform crystal direction, and the magnetic layer (i.e., the free layer 140) and the second tunnel barrier layer 150 have uniform crystallizability. The crystallizabilities of the first and second tunnel barrier layers 130 and 150 are improved to reduce the RA values and the resistance dispersions of the first and second tunnel barrier layers 130 and 150. Thus, the resistance difference between the first and second tunnel barrier layers 130 and 150 may increase.

As illustrated in FIG. 4, when the first tunnel barrier layer 130 is thicker than the second tunnel barrier layer 150, the resistance of the first tunnel barrier layer 130 may be greater than the resistance of the second tunnel barrier layer 150. Thus, the RA value of the first tunnel barrier layer 130 may be greater than the RA value of the second tunnel barrier layer 150. A RA ratio of the second tunnel barrier layer 150 to the first tunnel barrier layer 130 may have a range of about 1:5 to about 1:10. Here, a total RA value of the magnetic memory element may be a sum of the RA value of the first tunnel barrier layer 130 and the RA value of the second tunnel barrier layer 150. The maximum of the total RA value of the magnetic memory element may be about 30.

Additionally, when the tunnel barrier layer is formed of the magnesium oxide (MgO) layer, a surface roughness of a layer under the tunnel barrier layer may influence the crystallizability of the magnesium oxide (MgO) layer. Thus, the surface roughness of the first reference layer 120 under the first tunnel barrier layer 130 may be reduced for the formation of the first tunnel barrier layer 130 having excellent crystallizability. To achieve this, the surface roughness of the first reference layer 120 may be about 2 Å or less in an embodiment. Additionally, the first reference layer 120 may be formed of a perpendicular magnetic material having the $L1_1$ (superlattice) structure, such that the first tunnel barrier layer 130 having excellent crystallizability may be formed on the first reference layer 120.

In more detail, the first reference layer 120 may be formed of the perpendicular magnetic material having the $L1_1$ crystal structure as illustrated in FIG. 5. The perpendicular magnetic material having the $L1_1$ crystal structure may be formed by alternately and repeatedly depositing cobalt (Co) layers and platinum (Pt) layers. At this time, each of the cobalt (Co) layers and the platinum (Pt) layers may have a thickness of about 2 Å.

In an embodiment, each of the first and second tunnel barrier layers 130 and 150 formed by magnesium oxide (MgO) may be formed by the RF sputtering deposition method. In another embodiment, a magnesium (Mg) deposition process and an oxidation process may be alternately and repeatedly performed to form each of the first and second tunnel barrier layers 130 and 150 of magnesium oxide (MgO). Here, the magnesium (Mg) deposition process may use a DC or RF sputtering deposition method using a magnesium (Mg) target. The oxidation process may use a radical oxidation process.

In an embodiment, the first reference layer 120, the free layer 140, and the second reference layer 160 which are in contact with the first and second tunnel barrier layers 120 and 140 may be formed of amorphous magnetic materials. Thus, after the magnetic memory element is formed, a high temperature thermal annealing process may be performed for improving characteristics of the magnetic tunnel junction patterns. In other words, the magnetic layers and the second tunnel barrier layer 150 on the first tunnel barrier layer 130 may be crystallized using the first tunnel barrier layer 130 as a seed. The high temperature thermal annealing process may be performed at a temperature of about 300 degrees Celsius to about 360 degrees Celsius. The high temperature thermal annealing process may be a magnetic annealing process or other annealing processes. During the high temperature thermal annealing process, a heater (not illustrated) under the substrate 100 may be used as a heat source. The free layer 140 and the second tunnel barrier layer 150 may be crystallized using the first tunnel barrier layer 130 as the seed by the high temperature thermal annealing process. Thus, the crystallizabilities of the free layer 140 and the second tunnel barrier layer 150 may be improved on the first tunnel barrier layer 130.

Since the first tunnel barrier layer 130 is used as the seed, the bottom surface of the free layer 140 contacting the first tunnel barrier layer 130 may have substantially the same crystal plane as the top surface of the first tunnel barrier layer 130. For example, if the top surface of the first tunnel barrier layer 130 has the (001) crystal plane, the bottom surface of the free layer 140 may have a (001) crystal plane.

Figure 7:
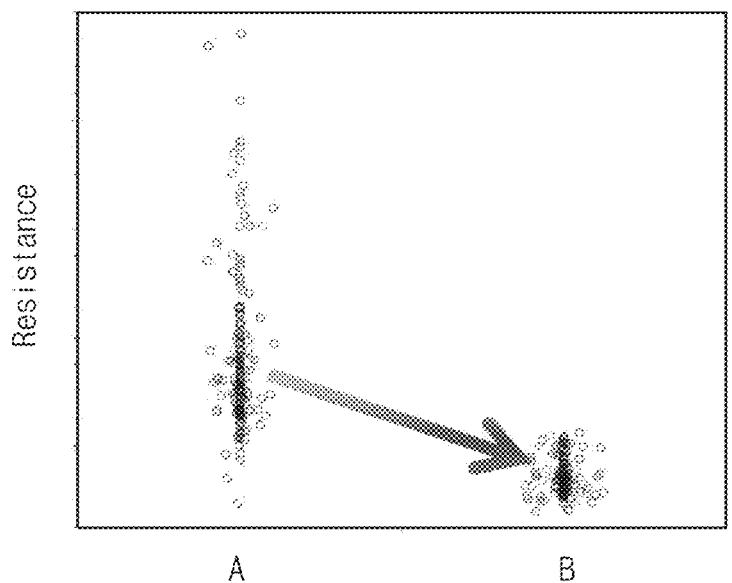
FIG. 7 is a graph illustrating resistance dispersion according to thicknesses of first and second tunnel barrier layers in a magnetic memory element according to exemplary embodiments of the inventive concept.

FIG. 7 is a graph illustrating resistance distribution according to thicknesses of first and second tunnel barrier layers in a magnetic memory element according to exemplary embodiments of the inventive concept.

In FIG. 7, a reference designator 'A' illustrates resistance distribution when the first tunnel barrier layer 130 is thinner than the second tunnel barrier layer 150, and a reference designator 'B' illustrates resistance distribution when the first tunnel barrier layer 130 is thicker than the second tunnel barrier layer 150

Referring to FIG. 7, when the first tunnel barrier layer 130 is thinner than the second tunnel barrier layer 150 (the reference designator A), the crystallizability of the first tunnel barrier layer 130 is deteriorated, such that the first and second tunnel barrier layers 130 and 150 have deteriorated cyrstallizabilities. Thus, the resistance dispersion may be great and the RA values increases.

On the other hand, when the first tunnel barrier layer 130 is thicker than the second tunnel barrier layer 150 (the reference designator B), the crystallizability of the second tunnel barrier layer 150 may be improved by the first tunnel barrier layer 130 having the excellent crystallizability. Thus, the resistance distribution and the RA values are reduced.

Figure 8:
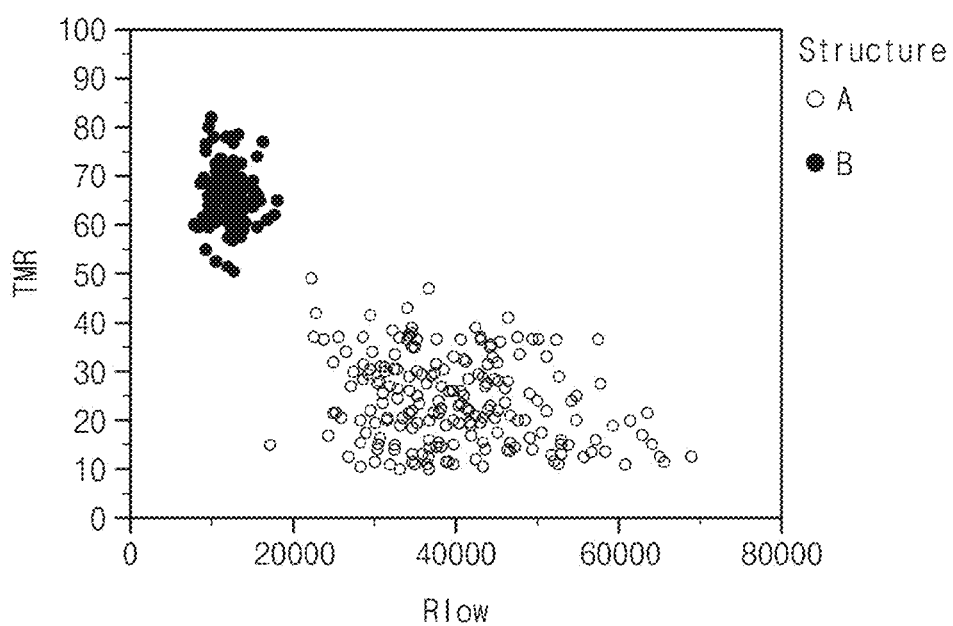
FIG. 8 is a graph illustrating a tunnel magnetoresistance ratio according to thicknesses of first and second tunnel barrier layers in a magnetic memory element according to exemplary embodiments of the inventive concept.

FIG. 8 is a graph illustrating a tunnel magnetoresistance ratio according to thicknesses of first and second tunnel barrier layers in a magnetic memory element according to exemplary embodiments of the inventive concept.

In FIG. 8, a reference designator 'A' illustrates a tunnel magnetoresistance ratio (TMR) when the first tunnel barrier layer 130 is thinner than the second tunnel barrier layer 150, and a reference designator 'B' illustrates a tunnel magnetoresistance ratio (TMR) when the first tunnel barrier layer 130 is thicker than the second tunnel barrier layer 150.

As illustrated in FIG. 8, the TMR of the magnetic memory element including the first tunnel barrier layer 130 thicker than the second tunnel barrier layer 150 is greater than the TMR of the magnetic memory element including the first tunnel barrier layer 130 thinner than the second tunnel barrier layer 150.

Figure 9:
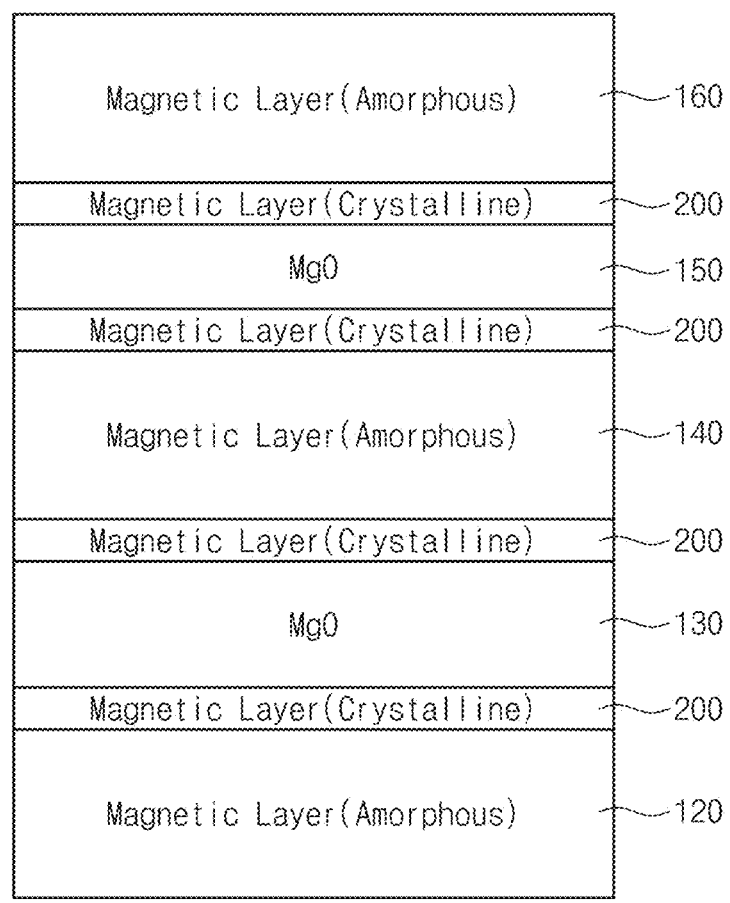
FIG. 9 is a cross-sectional view illustrating a modified example of a magnetic memory device according to a first embodiment of the inventive concept.

FIG. 9 is a cross-sectional view illustrating a modified example of a magnetic memory device according to a first embodiment of the inventive concept.

Referring to FIG. 9, crystalline magnetic layers 200 may be disposed between amorphous magnetic layers 120, 140, and 160 and the first and second tunnel barrier layers 130 and 150. A crystalline magnetic layer 200 may be disposed between the top surface of the first reference layer 120 and the bottom surface of the first tunnel barrier layer 130. A crystalline magnetic layer 200 may be disposed between the top surface of the first tunnel barrier layer 130 and the bottom surface of the free layer 140. A crystalline magnetic layer 200 may be disposed between the bottom surface of the second tunnel barrier layer 150 and the top surface of the free layer 140. A crystalline magnetic layer 200 may be disposed between the top surface of the second tunnel barrier layer 150 and the bottom surface of the second reference layer 160. The crystalline magnetic layers 200 may include at least one of Fe, Co, FeCo, or any alloy thereof. Each of the crystalline magnetic layers 200 may have a thickness of about 4 Å to about 5 Å.

When the free layer 140, the second tunnel barrier layer 150 and the second reference layer 160 are crystallized using the first tunnel barrier layer 130 by the annealing process, the crystallizabilities of the first and second tunnel barrier layers 130 and 150 may be more improved by the crystalline magnetic layers 200.

Figure 10:
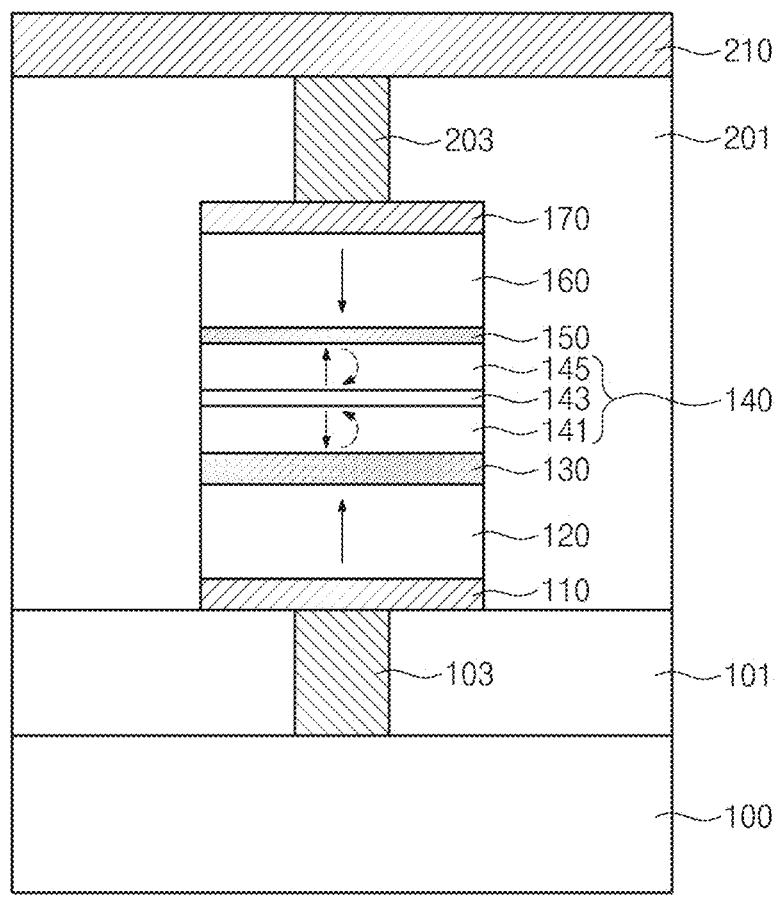
FIG. 10 is a cross-sectional view illustrating a magnetic memory device according to a second embodiment of the inventive concept.

FIG. 10 is a cross-sectional view illustrating a magnetic memory device according to a second embodiment of the inventive concept. In the present embodiment, the descriptions to the same elements as in the first embodiment of FIG. 3 will be omitted or mentioned briefly for the sake of simplicity.

Referring to FIG. 10, a magnetic memory element may be disposed between the lower contact plug 103 and the upper contact plug 203. As described in the first embodiment, the magnetic memory element may include a first magnetic tunnel junction pattern and a second magnetic tunnel junction pattern. In other words, the magnetic memory element may include the first reference layer 120, the first tunnel barrier layer 130, a free layer 140, the second tunnel barrier layer 150, and the second reference layer 160 disposed between the seed electrode layer 110 and the capping electrode layer 170.

In the present embodiment, the free layer 140 between the first and second tunnel barrier layers 130 and 150 may include a first free layer 141, a free exchange coupling layer 143, and a second free layer 145, which are sequentially stacked. The first free layer 141 may be in contact with the first tunnel barrier layer 130 and the free exchange coupling layer 143. The second free layer 145 may be in contact with the free exchange coupling layer 143 and the second tunnel barrier layer 150.

The first and second free layers 141 and 145 may have magnetization directions substantially perpendicular to the top surface of the substrate 100. The magnetization directions of the first and second free layers 141 and 145 may be changed into a first magnetization direction or a second magnetization direction anti-parallel to the first magnetization direction. The magnetization direction of the second free layer 145 may be coupled in anti-parallel to the magnetization direction of the first free layer 141 by the free exchange coupling layer 143.

The first and second free layers 141 and 145 may include a magnetic material. For example, the first and second free layers 141 and 145 may include at least one of CoFeB, CoFe, NiFe, CoFePt, CoFePd, CoFeCr, CoFeTb, CoFeGd, or CoFeNi. In an embodiment, if the first and second free layers 141 and 145 include CoFeTb, a content ratio of terbium (Tb) in CoFeTb of the first and second free layers 141 and 145 may be equal to or greater than about 10%. Likewise, if the first and second free layers 141 and 145 include CoFeGd, a content ratio of gadolinium (Gd) in CoFeGd of the first and second free layers 141 and 145 may be equal to or greater than about 10%. In another embodiment, the first and second free layers 141 and 145 may include at least one of a perpendicular magnetic material having an $L1_0$ structure, CoPt of a hexagonal close packed (HCP) lattice structure, or any alloy thereof.

The free exchange coupling layer 143 may couple the magnetization direction of the first free layer 141 and the magnetization direction of the second layer 141 in anti-parallel to each other. A coupling force between the magnetization directions of the first and second free layers 141 and 145 may be enhanced by the free exchange coupling layer 143. The free exchange coupling layer 143 may include at least one of rare metals (e.g., ruthenium, iridium, and rhodium).

Figure 11:
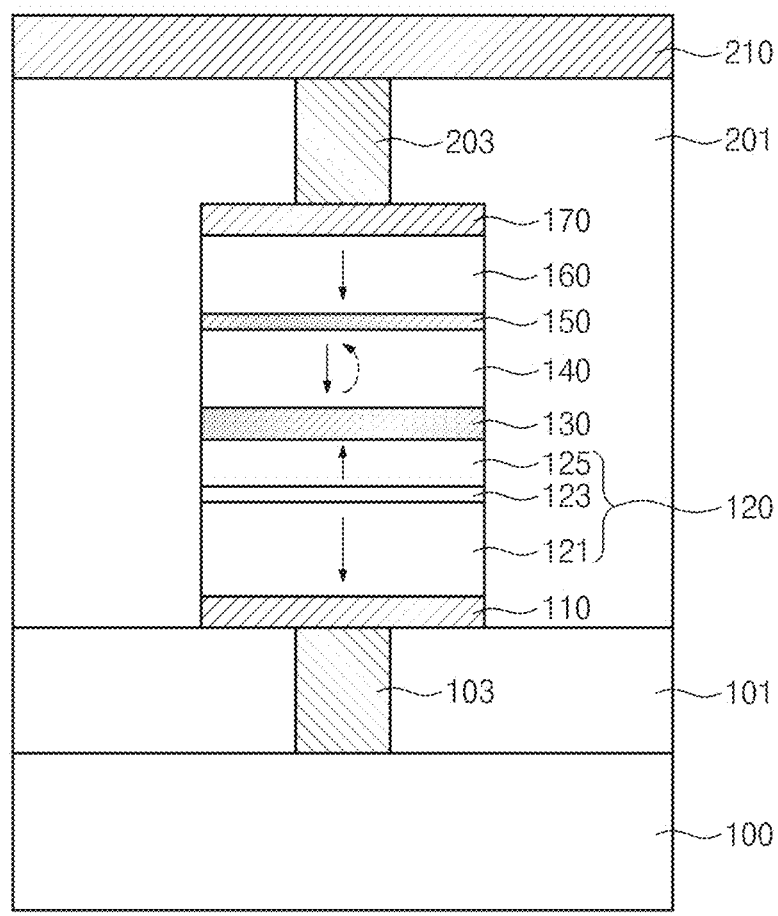
FIG. 11 is a cross-sectional view illustrating a magnetic memory device according to a third embodiment of the inventive concept.

FIG. 11 is a cross-sectional view illustrating a magnetic memory device according to a third embodiment of the inventive concept. In the present embodiment, the descriptions to the same elements as in the first embodiment will be omitted or mentioned briefly for the purpose of ease and convenience in explanation.

Referring to FIG. 11, a magnetic memory element may include a first magnetic tunnel junction pattern and a second magnetic tunnel junction pattern similarly to the first embodiment. In other words, the magnetic memory element may include a first reference layer 120, the first tunnel barrier layer 130, the free layer 140, the second tunnel barrier layer 150, and the second reference layer 160 disposed between the seed electrode layer 110 and the capping electrode layer 170. Here, the first and second tunnel barrier layers 130 and 150 may be formed of the magnesium oxide (MgO) layer, and the first tunnel barrier layer 130 may be thicker than the second tunnel barrier layer 150. Additionally, the RA value of the first tunnel barrier layer 130 may be greater than the RA value of the second tunnel barrier layer 150.

In the present embodiment, the first reference layer 120 may include a reference perpendicular magnetic layer 121, a spin polarization layer 125, and a reference exchange coupling layer 123 disposed between the reference perpendicular magnetic layer 121 and the spin polarization layer 125. The spin polarization layer 125 may be in contact with the first tunnel barrier layer 130, and the reference perpendicular magnetic layer 121 may be in contact with the seed electrode layer 110. The reference perpendicular magnetic layer 121 may have a first magnetization which is substantially perpendicular to the top surface of the substrate 100 and is fixed. The spin polarization layer 125 may have a second magnetization which is substantially perpendicular to the top surface of the substrate 100 and is fixed.

The reference perpendicular magnetic layer 121 may include a material and/or a structure spontaneously having the first magnetization direction. For example, the reference perpendicular magnetic layer 121 may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, or any alloy thereof. The perpendicular magnetic material having the $L1_0$ structure may include FePt of the $L1_0$ structure, FePd of the $L1_0$ structure, CoPd of the $L1_0$ structure, and/or CoPt of the $L1_0$ structure. If the reference perpendicular magnetic layer 121 includes CoFeTb, a content ratio of terbium (Tb) in CoFeTb may be equal to or greater than about 10%. Likewise, if the reference perpendicular magnetic layer 121 includes CoFeGd, a content ratio of gadolinium (Gd) in CoFeGd may be equal to or greater than about 10%.

In another embodiment, the reference perpendicular magnetic layer 121 may include a perpendicular magnetic structure having magnetic layers and non-magnetic layers alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacking the magnetic layer and the non-magnetic layer).

The spin polarization layer 125 may include a magnetic material. The second magnetization direction of the spin polarization layer 125 may be fixed by the reference perpendicular magnetic layer 121. For example, the spin polarization layer 125 may include at least one of CoFeB, CoFe, NiFe, CoFePt, CoFePd, CoFeCr, CoFeTb, CoFeGd, or CoFeNi. If the spin polarization layer 125 includes iron (Fe) and cobalt (Co), a content ratio of iron (Fe) may be greater than a content ratio of cobalt (Co) in the spin polarization layer 125. Thus, the second magnetization direction of the spin polarization layer 125 may become easily perpendicular to the top surface of the substrate 100.

The reference exchange coupling layer 123 may couple the magnetization direction of the reference perpendicular magnetic layer 121 and the magnetization direction of the spin polarization layer 125 in anti-parallel to each other. Thus, a magnetic stray field caused by the first reference layer 120 may be reduced or minimized to improve reliability of the magnetic memory device. A coupling force between the magnetization directions of the reference perpendicular magnetic layer 121 and the spin polarization layer 124 may be enhanced by the reference exchange coupling layer 123. For example, the reference exchange coupling layer 123 may include at least one of rare metals (e.g., ruthenium, iridium, and rhodium).

Alternatively, the reference exchange coupling layer 123 may couple the magnetization direction of the reference perpendicular magnetic layer 121 and the magnetization direction of the spin polarization layer 125 in parallel to each other. In this case, the reference exchange coupling layer 123 may include at least one of a non-magnetic metal (e.g., titanium, tantalum, or magnesium), oxides or nitrides thereof.

Meanwhile, in another embodiment, the spin polarization layer 125 may be in contact with the reference perpendicular magnetic layer 121. In this case, the second magnetization direction of the spin polarization layer 125 may be parallel to the first magnetization direction of the reference perpendicular magnetic layer 121.

Figure 12:
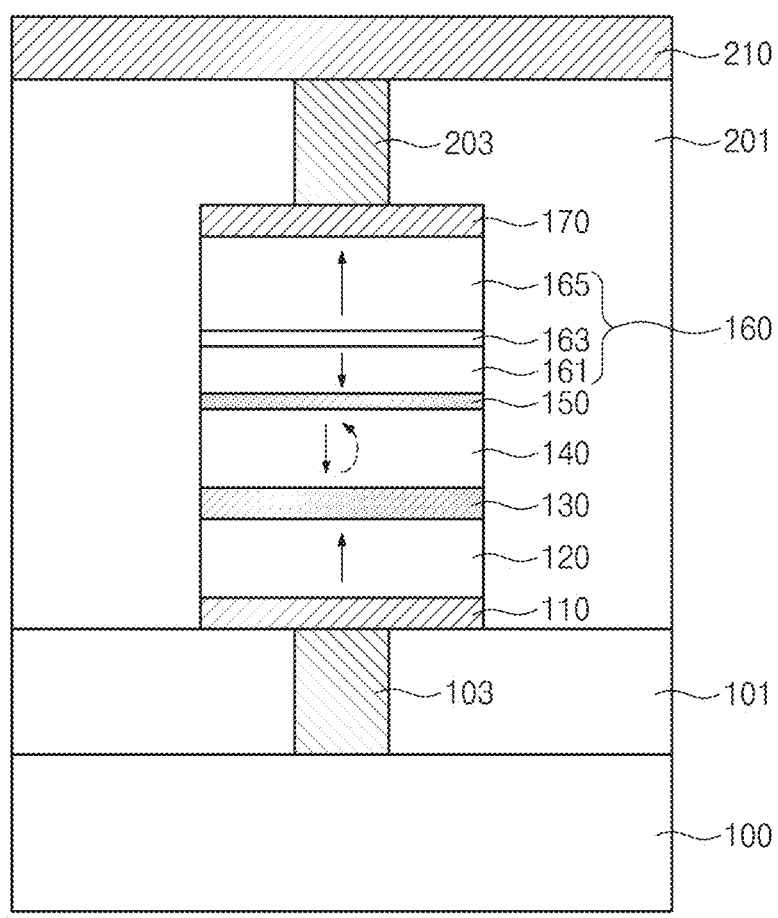
FIG. 12 is a cross-sectional view illustrating a magnetic memory device according to a fourth embodiment of the inventive concept.

FIG. 12 is a cross-sectional view illustrating a magnetic memory device according to a fourth embodiment of the inventive concept. In the present embodiment, the descriptions to the same elements as in the first embodiment will be omitted or mentioned briefly for the purpose of ease and convenience in explanation.

Referring to FIG. 12, a magnetic memory element may be disposed between the lower contact plug 103 and the upper contact plug 203. Similarly to the first embodiment, the magnetic memory element may include a first magnetic tunnel junction pattern and a second magnetic tunnel junction pattern. In other words, the magnetic memory element may include the first reference layer 120, the first tunnel barrier layer 130, the free layer 140, the second tunnel barrier layer 150, and a second reference layer 160 disposed between the seed electrode layer 110 and the capping electrode layer 170. The first and second tunnel barrier layers 130 and 150 may be formed of magnesium oxide (MgO), and the first tunnel barrier layer 130 may be thicker than the second tunnel barrier layer 150. Also, the RA value of the first tunnel barrier layer 130 may be greater than the RA value of the second tunnel barrier layer 150.

In the present embodiment, the second reference layer 160 on the second tunnel barrier layer 150 may include a reference perpendicular magnetic layer 165, a spin polarization layer 161, and a reference exchange coupling layer 163 disposed between the reference perpendicular magnetic layer 165 and the spin polarization layer 161. The spin polarization layer 161 may be in contact with the top surface of the second tunnel barrier layer 150.

The reference perpendicular magnetic layer 165 may have a first magnetization which is substantially perpendicular to the top surface of the substrate 100 and is fixed. The spin polarization layer 161 may have a second magnetization which is substantially perpendicular to the top surface of the substrate 100 and is fixed. The reference perpendicular magnetic layer 165 may include a material and/or a structure spontaneously having the first magnetization direction. The spin polarization layer 161 may include a magnetic material. The second magnetization direction of the spin polarization layer 161 may be fixed by the reference perpendicular magnetic layer 165. The reference exchange coupling layer 163 may couple the magnetization direction of the reference perpendicular magnetic layer 165 and the magnetization direction of the spin polarization layer 161 in parallel or anti-parallel to each other.

In another embodiment, the second reference layer 160 may include the reference perpendicular magnetic layer 165 and the spin polarization layer 161, and the reference perpendicular magnetic layer 165 may be in contact with the spin polarization layer 161.

Figure 13:
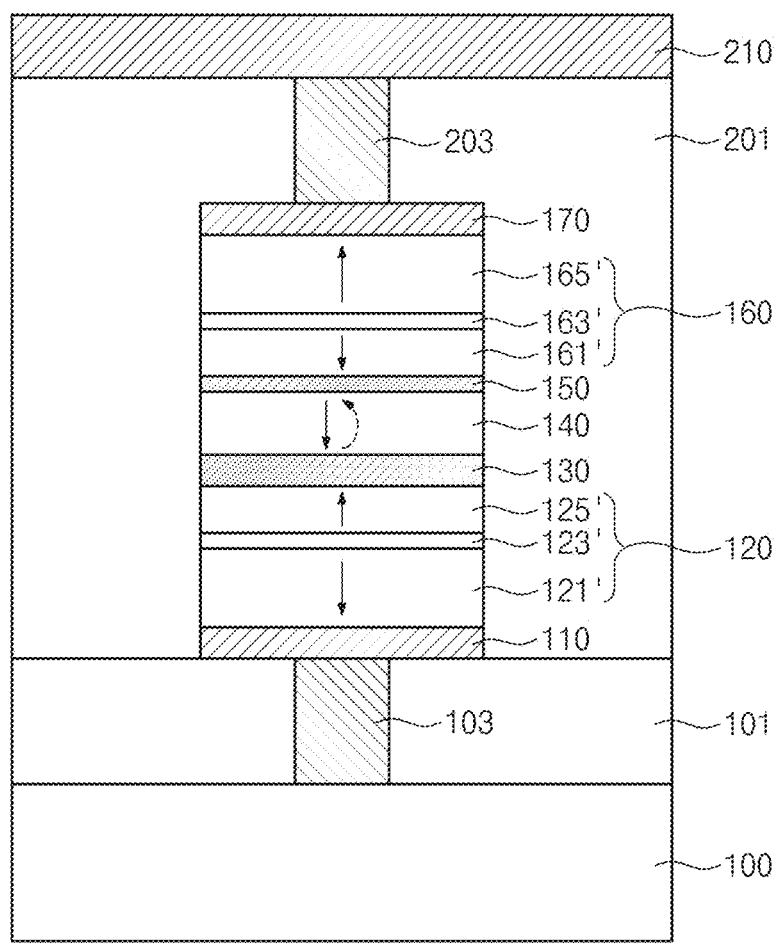
FIG. 13 is a cross-sectional view illustrating a magnetic memory device according to a fifth embodiment of the inventive concept.

FIG. 13 is a cross-sectional view illustrating a magnetic memory device according to a fifth embodiment of the inventive concept. In the present embodiment, the descriptions to the same elements as in the first, third, and fourth embodiments will be omitted or mentioned briefly for the purpose of ease and convenience in explanation.

Referring to FIG. 13, a magnetic memory element may be disposed between the lower contact plug 103 and the upper contact plug 203. Similarly to the first embodiment, the magnetic memory element may include a first magnetic tunnel junction pattern and a second magnetic tunnel junction pattern. In other words, the magnetic memory element may include the first reference layer 120, the first tunnel barrier layer 130, the free layer 140, the second tunnel barrier layer 150, and the second reference layer 160 disposed between the seed electrode layer 110 and the capping electrode layer 170. The first and second tunnel barrier layers 130 and 150 may be formed of magnesium oxide (MgO), and the first tunnel barrier layer 130 may be thicker than the second tunnel barrier layer 150. Also, the RA value of the first tunnel barrier layer 130 may be greater than the RA value of the second tunnel barrier layer 150.

In the present embodiment, the first reference layer 120 may include the reference perpendicular magnetic layer 121, the spin polarization layer 125, and the reference exchange coupling layer 123 disposed between the reference perpendicular magnetic layer 121 and the spin polarization layer 125. In an embodiment, the spin polarization layer 125 of the first reference layer 120 may be in contact with the bottom surface of the first tunnel barrier layer 130. The reference perpendicular magnetic layer 121 of the first reference layer 120 may have a first magnetization direction which is perpendicular to the top surface of the substrate 100 and is fixed. The spin polarization layer 125 of the first reference layer 120 may have a magnetization direction which is substantially perpendicular to the top surface of the substrate 100 and is parallel or anti-parallel to the first magnetization direction of the reference perpendicular magnetic layer 121 by the reference exchange coupling layer 123.

The second reference layer 160 may include the spin polarization layer 161, the reference perpendicular magnetic layer 165, and the reference exchange coupling layer 163 disposed between the spin polarization layer 161 and the reference perpendicular magnetic layer 165. The spin polarization layer 161 may be in contact with the top surface of the second tunnel barrier layer 150. The reference perpendicular magnetic layer 165 of the second reference layer 160 may have a second magnetization direction which is substantially perpendicular to the top surface of the substrate 100 and is fixed. The spin polarization layer 161 of the second reference layer 160 may have a magnetization direction which is substantially perpendicular to the top surface of the substrate 100 and is parallel or anti-parallel to the second magnetization direction of the reference perpendicular magnetic layer 165 by the reference exchange coupling layer 163.

Figure 14:
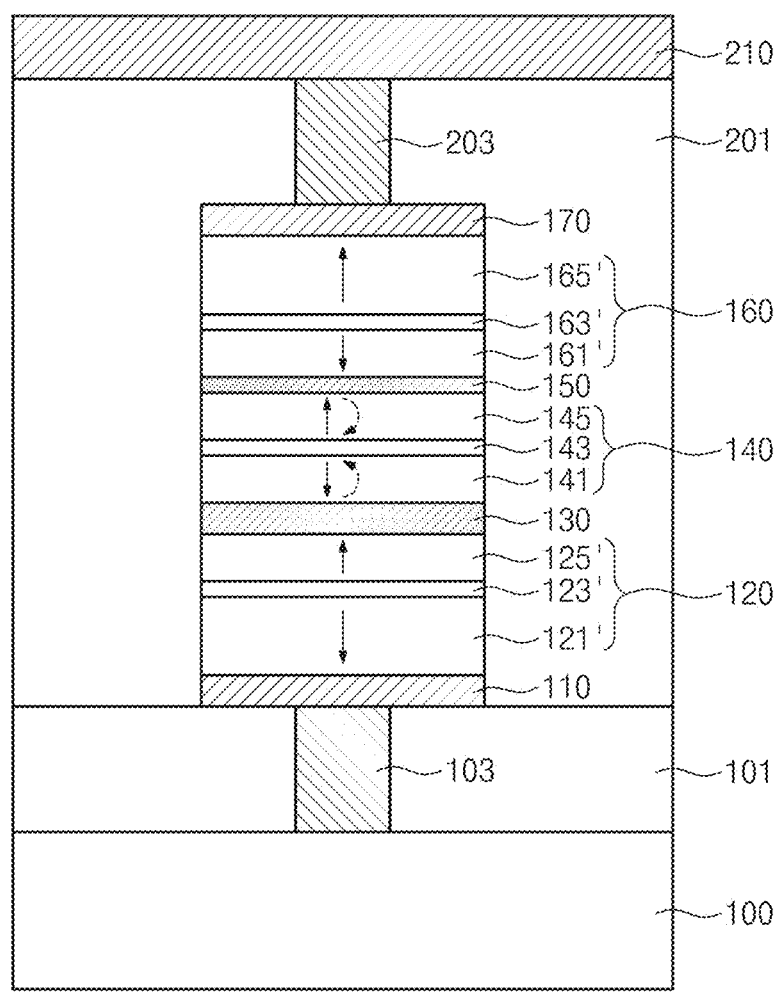
FIG. 14 is a cross-sectional view illustrating a magnetic memory device according to a sixth embodiment of the inventive concept.

FIG. 14 is a cross-sectional view illustrating a magnetic memory device according to a sixth embodiment of the inventive concept. In the present embodiment, the descriptions to the same elements as in the first, second, third, and fourth embodiments will be omitted or mentioned briefly for the purpose of ease and convenience in explanation.

Referring to FIG. 14, a magnetic memory element may be disposed between the lower contact plug 103 and the upper contact plug 203. The magnetic memory element may include a first magnetic tunnel junction pattern and a second magnetic tunnel junction pattern. In other words, the magnetic memory element may include the first reference layer 120, the first tunnel barrier layer 130, the free layer 140, the second tunnel barrier layer 150, and the second reference layer 160 disposed between the seed electrode layer 110 and the capping electrode layer 170. The first and second tunnel barrier layers 130 and 150 may be formed of magnesium oxide (MgO), and the first tunnel barrier layer 130 may be thicker than the second tunnel barrier layer 150. Also, the RA value of the first tunnel barrier layer 130 may be greater than the RA value of the second tunnel barrier layer 150.

In the present embodiment, the first reference layer 120 may include the reference perpendicular magnetic layer 121, the spin polarization layer 125, and the reference exchange coupling layer 123 disposed between the reference perpendicular magnetic layer 121 and the spin polarization layer 125. In an embodiment, the spin polarization layer 125 of the first reference layer 120 may be in contact with the bottom surface of the first tunnel barrier layer 130. The reference perpendicular magnetic layer 121 of the first reference layer 120 may have the first magnetization direction which is substantially perpendicular to the top surface of the substrate 100 and is fixed. The spin polarization layer 125 of the first reference layer 120 may have the magnetization direction which is substantially perpendicular to the top surface of the substrate 100 and is parallel or anti-parallel to the first magnetization direction of the reference perpendicular magnetic layer 121 by the reference exchange coupling layer 123.

The second reference layer 160 may include the spin polarization layer 161, the reference perpendicular magnetic layer 165, and the reference exchange coupling layer 163 disposed between the spin polarization layer 161 and the reference perpendicular magnetic layer 165. The spin polarization layer 161 may be in contact with the top surface of the second tunnel barrier layer 150. The reference perpendicular magnetic layer 165 of the second reference layer 160 may have the second magnetization direction substantially perpendicular to the top surface of the substrate 100 and is fixed. The spin polarization layer 161 of the second reference layer 160 may have the magnetization direction substantially perpendicular to the top surface of the substrate 100 and is parallel or anti-parallel to the second magnetization direction of the reference perpendicular magnetic layer 165 by the reference exchange coupling layer 163.

The free layer 140 may include the first free layer 141, the free exchange coupling layer 143, and the second free layer 145, which are sequentially stacked. The first free layer 141 may be in contact with the first tunnel barrier layer 130 and the free exchange coupling layer 143. The second free layer 145 may be in contact with the free exchange coupling layer 143 and the second tunnel barrier layer 150. The first and second free layers 141 and 145 may have magnetization directions substantially perpendicular to the top surface of the substrate 100. The magnetization directions of the first and second free layers 141 and 145 may be changed to be parallel or anti-parallel to the first or second magnetization. The magnetization direction of the second free layer 145 may be coupled in anti-parallel to the magnetization direction of the first free layer 141.

Figure 15:
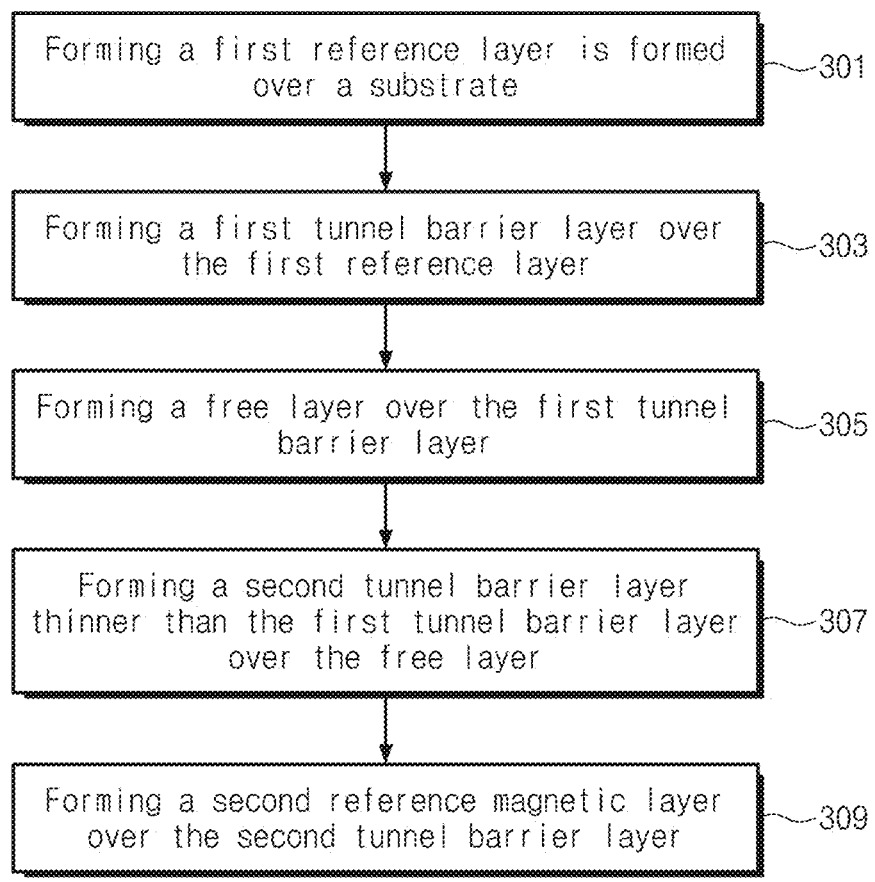
FIG. 15 is a flow chart exemplarily illustrating a method of fabricating a magnetic device according to some embodiments of the inventive concepts.

FIG. 15 depicts an exemplary embodiment of a method for fabricating a magnetic device discussed above. For simplicity, some steps may be omitted or combined. Referring to FIG. 15, a first reference layer is formed over a substrate at step 301. A first tunnel barrier layer is then formed overlying the first reference layer at step 303. A free layer is formed overlying the first tunnel barrier layer at step 305. Next, a second tunnel barrier layer is formed overlying the free layer at step 307. In some embodiments, the second tunnel barrier layer may be formed thinner than the first tunnel barrier layer. A resistance-area product (RA) value of the first tunnel barrier layer may be greater than a RA value of the second tunnel barrier layer. A second reference magnetic layer is formed overlying the second tunnel barrier layer at step 309. In some embodiments, at least one of the first reference magnetic layer, the second reference magnetic layer, or the free layer may have a magnetization direction substantially perpendicular to a top surface of the substrate. On the other hand, at least one of the first reference magnetic layer, the second reference magnetic layer, or the free layer may have a magnetization including components in plane and perpendicular-to-plane.

Figure 16:
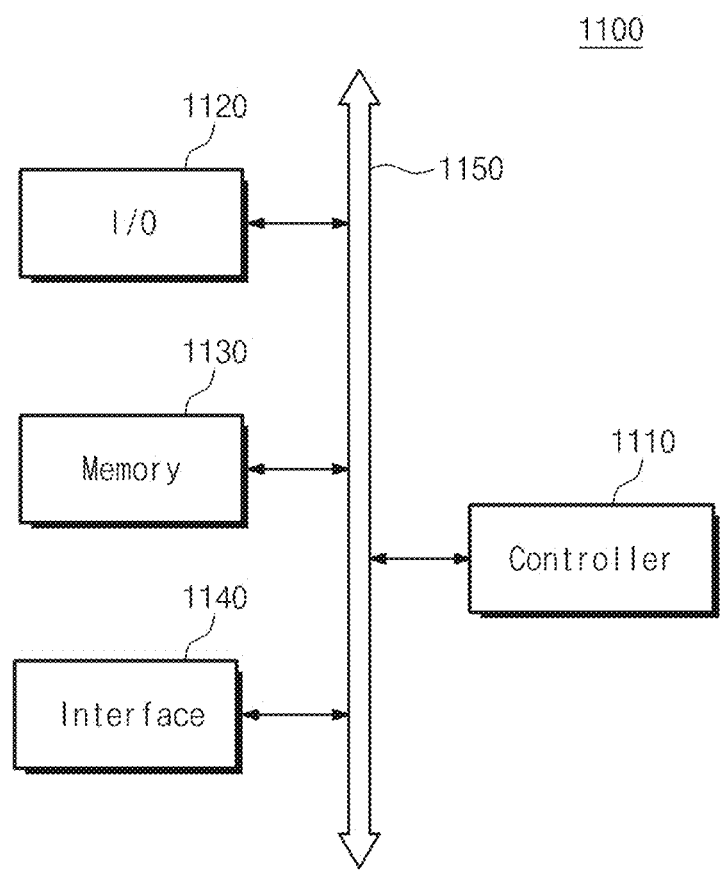
FIG. 16 is a schematic block diagram illustrating an example of memory systems including magnetic memory devices according to embodiments of the inventive concept.

FIG. 16 is a schematic block diagram illustrating an example of memory systems including magnetic memory devices according to some embodiments of the inventive concept.

Referring to FIG. 16, a memory system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the magnetic memory devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the memory system 1100 may further include a fast DRAM device and/or a fast SRAM device which acts as a cache memory for improving an operation of the controller 1110.

The memory system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 17:
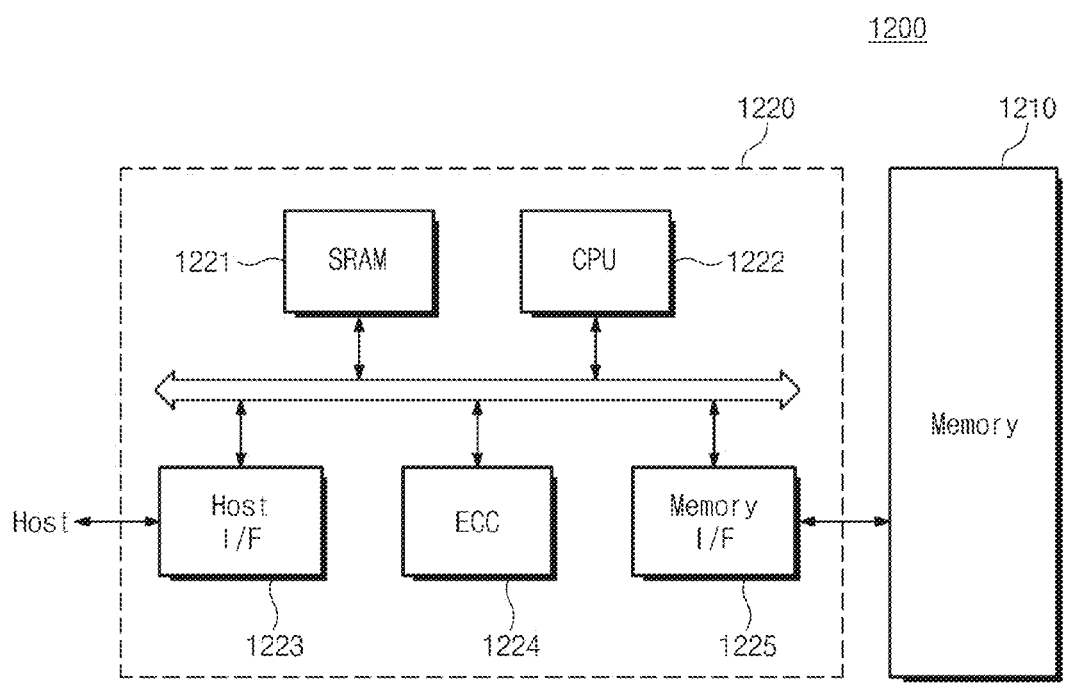
FIG. 17 is a schematic block diagram illustrating an example of memory cards including magnetic memory devices according to embodiments of the inventive concept.

FIG. 17 is a schematic block diagram illustrating an example of memory cards including magnetic memory devices according to embodiments of the inventive concept.

Referring to FIG. 17, a memory card 1200 may include a memory device 1210. The memory device 1210 may include at least one of the magnetic memory devices according to the embodiments mentioned above. In other embodiments, the memory device 1210 may further include another type of semiconductor memory devices (e.g., a DRAM device and/or a SRAM device) which are different from the magnetic memory devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

Figure 18:
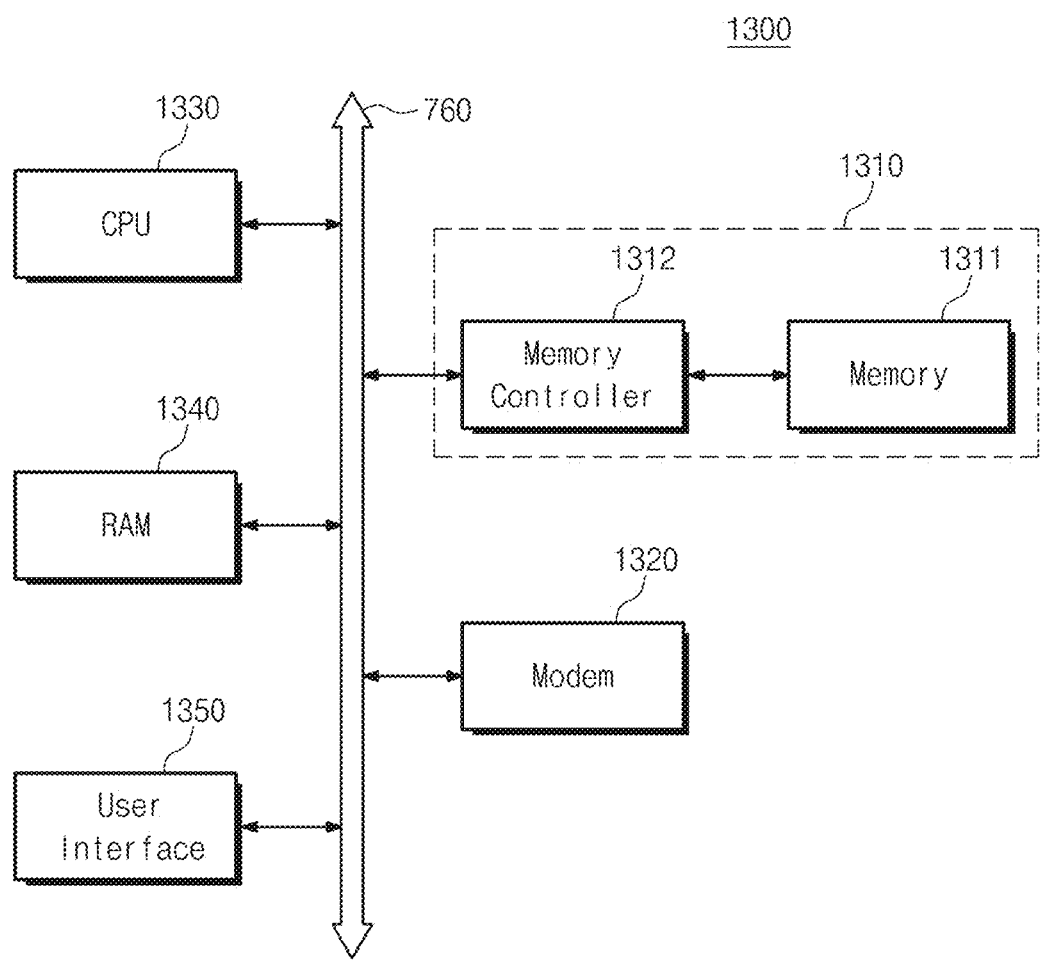
FIG. 18 is a schematic block diagram illustrating an example of information processing systems including magnetic memory devices according to embodiments of the inventive concept.

FIG. 18 is a schematic block diagram illustrating an example of information processing systems including magnetic memory devices according to embodiments of the inventive concept.

Referring to FIG. 18, at least one of the magnetic memory devices according to aforementioned embodiments may be installed in a memory system 1310, and the memory system 1310 may be installed in an information processing system 1300 such as a mobile device or a desk top computer. The information processing system 1300 according to the inventive concept may further include a MODEM 1320, a central processing unit (CPU) 1330, a RAM 1340, and a user interface unit 1350 that are electrically connected the memory system 1310 through a system bus 1360. The memory system 1310 may be substantially the same as the aforementioned memory card 1200 of FIG. 16. In other words, the memory system 1310 may include a memory device 1311 and a memory controller 1312 controlling overall operations of the memory device 1311. Data processed by the CPU 1330 or data inputted from an external system may be stored in the memory system 1310. The memory system 1310 may be realized as a solid state disk (SSD). In this case, the information processing system 1300 may stably store massive data in the memory system 1310. Reliability of the memory system 1310 increases, so that the memory system 1310 may decrease a resource for correcting errors to provide a high speed data exchange function to the information processing system 1300. Even though not shown in the drawings, the information processing system 1300 according to the inventive concept may further include an application chipset, a camera image processor (CIS), and/or an input/output unit.

The magnetic memory devices and the memory systems according to the inventive concept may be encapsulated using various packaging techniques. For example, the magnetic memory devices and the memory systems according to the inventive concept may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to embodiments of the inventive concept, the thick magnesium oxide (MgO) layer having the excellent crystallizability is disposed under the thin magnesium oxide (MgO) layer in the magnetic memory element including the first and second tunnel barrier layers formed of magnesium oxide (MgO). Thus, when the magnetic layers and the thin magnesium oxide (MgO) layer on the thick magnesium oxide (MgO) layer are cystallized, the thick magnesium oxide (MgO) layer may be used as the seed. Thus, the crystallizabilities of the magnetic layers and the thin magnesium oxide (MgO) layer may be improved. As a result, the crystallizability of the magnetic memory element may be improved to reduce the resistance dispersion and the RA value.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A magnetic memory device comprising:
   a first tunnel barrier layer disposed at a first height from a substrate;
   a second tunnel barrier layer disposed at a second height greater than the first height from the substrate, the second tunnel barrier layer thinner than the first tunnel barrier layer;
   a free layer disposed between the first tunnel barrier layer and the second tunnel barrier layer;
   a first reference magnetic layer disposed under the first tunnel barrier layer;
   a second reference magnetic layer disposed over the second tunnel barrier layer,
   wherein the first reference magnetic layer, the second reference magnetic layer, and the free layer each have a magnetization direction substantially perpendicular to a top surface of the semiconductor substrate, and
   wherein the first and second tunnel barrier layers are formed of magnesium oxide (MgO).

2. The magnetic memory device of claim 1, wherein a resistance-area product (RA) value of the first tunnel barrier layer is greater than a RA value of the second tunnel barrier layer.

3. The magnetic memory device of claim 1, wherein a ratio of a resistance-area product (RA) value of the second tunnel barrier layer to a RA value of the first tunnel barrier layer has a range of about 1:5 to about 1:10.

4. The magnetic memory device of claim 1, wherein the first and second tunnel barrier layers are formed of magnesium oxide (MgO) having a (001) crystal plane substantially parallel to a top surface of the substrate.

5. The magnetic memory device of claim 1, wherein the first reference magnetic layer is in contact with a first surface of the first tunnel barrier layer;
   wherein the free layer is in contact with a second surface opposite to the first surface of the first tunnel barrier layer; and
   wherein a top surface of the free layer has a (001) crystal plane.

6. The magnetic memory device of claim 1, wherein the free layer is formed of a magnetic material aligned in a (001) crystal plane of the first tunnel barrier layer.

7. The magnetic memory device of claim 1, further comprising:
   a crystalline magnetic layer disposed between the first reference magnetic layer and the first tunnel barrier layer, between the free layer and the first tunnel barrier layer, between the second reference magnetic layer and the second tunnel barrier layer, and/or between the free layer and the second tunnel barrier layer.

8. The magnetic memory device of claim 7, wherein the crystalline magnetic layer includes at least one of Fe, Co, FeCo, or any alloy thereof.

9. The magnetic memory device of claim 7, wherein the crystalline magnetic layer has a thickness of about 4 Å to about 5Å.

10. A magnetic memory device comprising:
    a bit line disposed on a substrate;
    a MTJ structure disposed between the bit line and the substrate, the MTJ structure including:
    a first reference magnetic layer;
    a second reference magnetic layer;

a free layer disposed between the first reference magnetic layer and the second reference magnetic layer;

a first tunnel barrier layer between the first reference magnetic layer and the free layer; and a second tunnel barrier layer between the second reference magnetic layer and the free layer, the second tunnel barrier layer thinner than the first tunnel barrier layer, wherein the first tunnel barrier layer is disposed at a first height from a top surface of the substrate, wherein the second tunnel barrier layer is disposed at a second height greater than the first height from the top surface of the substrate, and wherein the bit line is disposed at a third height greater than the second height from the top surface of the substrate, wherein the second tunnel barrier layer is closer to the bit line than to the substrate, and the first tunnel barrier layer is further away from the bit line than the second tunnel barrier layer.

11. The magnetic memory device of claim 10, wherein the first and second tunnel barrier layers are formed of magnesium oxide (MgO).

12. The magnetic memory device of claim 10, the first reference magnetic layer is in direct contact with a bottom surface of the first tunnel barrier layer and has the $L1_1$ crystal structure.

13. The magnetic memory device of claim 10, wherein a top surface of the first reference magnetic layer is in direct contact with a bottom surface of the first tunnel barrier layer and has a mean surface roughness of about 2 Å or less.

14. A magnetic memory device comprising:

a first tunnel barrier layer disposed at a first height from a substrate;

a second tunnel barrier layer disposed at a second height greater than the first height from the substrate, the second tunnel barrier layer thinner than the first tunnel barrier layer;

a free layer disposed between the first tunnel barrier layer and the second tunnel barrier layer;

a first reference magnetic layer disposed under the first tunnel barrier layer; and a second reference magnetic layer disposed over the second tunnel barrier layer, wherein the first reference magnetic layer, the second reference magnetic layer, and the free layer each have a magnetization direction substantially perpendicular to a top surface of the substrate, wherein the first and second tunnel barrier layers are formed of magnesium oxide (MgO) having a (001) crystal plane substantially parallel to a top surface of the substrate.

* * * * *